United States Patent [19]

Mittenbühler et al.

[11] Patent Number: 5,333,371
[45] Date of Patent: Aug. 2, 1994

[54] METHOD FOR THE MANUFACTURE OF AN INDICATING INSTRUMENT

[75] Inventors: Karl-Heinz Mittenbühler, Griesheim; Heinrich-Jochen Blume, Darmstadt, both of Fed. Rep. of Germany

[73] Assignee: VDO Adolf Schindling AG, Frankfurt, Fed. Rep. of Germany

[21] Appl. No.: 101,373

[22] Filed: Aug. 3, 1993

[30] Foreign Application Priority Data

Aug. 6, 1992 [DE] Fed. Rep. of Germany ....... 4226017

[51] Int. Cl.[5] ............................................. G01R 3/00
[52] U.S. Cl. ....................................... 29/595; 29/593; 318/696
[58] Field of Search ...................... 29/595, 602.1, 622, 29/593; 318/696

[56] References Cited

U.S. PATENT DOCUMENTS 5,032,781  7/1991  Kronenberg .

FOREIGN PATENT DOCUMENTS 3921462  8/1990  Fed. Rep. of Germany .

Primary Examiner—Carl E. Hall
Attorney, Agent, or Firm—Martin A. Farber

[57] ABSTRACT

A method is provided for manufacture of an electronically synchronizable indicating instrument the pointer of which can be turned between a zero stop and a scale-end by means of a stepping motor via a multi-step gearing, wherein the stepping motor has a two-pole rotor of magnetizable material, two coils arranged perpendicular to each other, and a housing surrounding the coils, the motor being adapted to be controlled by a microprocessor. The stepping motor is assembled with a non-magnetized rotor, and the instrument includes a gear train, and a pointer having a torsion spring which acts in the direction towards full scale. In the procedure of the method, the pointer is brought to rest against the zero stop by means of a moment of rotation applied from the outside in opposition to the restoring force of the torsion spring. The rotor of the stepping motor is turned in the direction towards the zero stop of the pointer by means of a rotating magnetic field with the carrying along of gear wheels until no gearing play is present any longer. Then, the rotor is held in the position reached, and is magnetized in a predetermined angular direction.

7 Claims, 1 Drawing Sheet

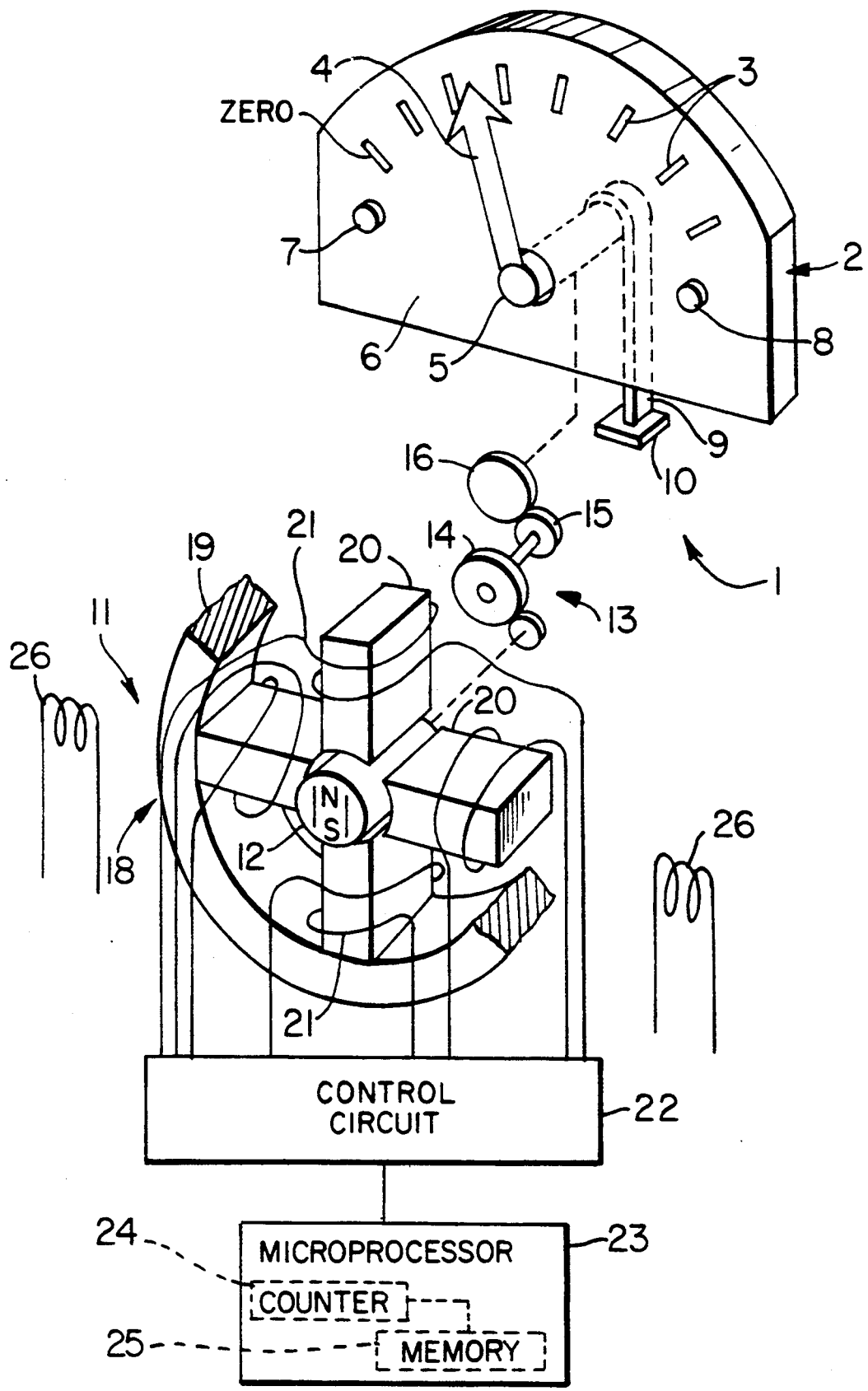

METHOD FOR THE MANUFACTURE OF AN INDICATING INSTRUMENT

FIELD AND BACKGROUND OF THE INVENTION

The present invention relates to a method of manufacturing an electronically synchronizable indicator instrument having a pointer which is turned by a stepping motor operating via a multi-step gearing between a zero stop and a scale end, wherein the stepping motor has a two-pole rotor of magnetizable material, two coils arranged perpendicular thereto, and a housing surrounding the coils, the motor being controlled by a microprocessor.

In such indicating instruments, in view of the insertion of the multi-step gearing between motor pinion and pointer shaft no reliable conclusions as to the position of the pointer can be drawn from the number of steps stored in the counter of the microprocessor, i.e. from the position of the rotor of the stepping motor, since the numerical value stored may be faulty for various reasons. In order that no erroneous indications result therefrom, the counter must be constantly resynchronized with the position of the pointer For this in the method in accordance with U.S. Pat. No. 5,032,781, the zero position of the pointer defined by a mechanical stop is used in combination with a test program in which the stepping motor is advanced in the direction of the zero position in the sense of a movement of the pointer until the end of the movement of the pointer is noted from the absence of an induced voltage in that winding of the stepping motor which is not being passed through at the time by current for the driving of the pointer. The counter is then set to zero or to the value corresponding to the zero position of the pointer.

This method operates satisfactorily but in the case of 90° steps per revolution of the rotor requires four switching and four test routines, which is too cumbersome from a switching standpoint. In German Patent Application P 42 00 551, corresponding to U.S. application Ser. No. 07/959,736 filed Oct. 13, 1992, it has therefore been proposed that a given orientation of the two-pole rotor be associated with the zero position of the pointer upon the assemblying of the stepping motor and the indicating instrument. At the start of the synchronization process, the rotor is, in each case, first brought into this given orientation. In order to note the induction or the absence thereof, it is then necessary also to test the position of the rotor which follows this given orientation by one step. By the associating of a given orientation of the rotor with the zero position of the pointer, a sort of one-time mechanical presynchronization is obtained. In this way, assurance is had that the zero position of the pointer can be reached only upon a given step of the rotor, as a result of which, in the event of 90° steps, in each case only one of four steps must be checked and the expense for switching can be reduced by 50% as compared with the old method since now only one of the two windings need still be connected alternatively to the source of voltage and the measuring mechanism.

However, it has been found that the associating of the pointer position with the rotor position which is to be effected upon the assembly entails certain difficulties. In one concrete case of use, a three-step gearing with a transmission ratio of 1:43 is provided. In this case one must expect a gearing play of about 30°. In order to avoid this, a spring is provided which urges the pointer in one direction of rotation. This urging is maintained also upon reversal of the direction of rotation.

In order to reduce the noise, only an odd number of gear wheels is used. This has the result that the gearing must be assembled in a very specific constellation if rotor and pointer are to be associated with each other in the manner necessary for the shortened process of synchronization. The assembling of the gearing is therefore very tedious and furthermore entails considerable possibilities of error.

SUMMARY OF THE INVENTION

It is an object of the invention to create the prerequisites for the use of the shortened synchronization process at little expense and with a smaller percentage of errors, i.e., to realize the mechanical presynchronization in a simple manner which can be used for mass production and is very reliable.

According to the invention, it is provided that
a stepping motor with non-magnetized rotor, a gearing, and a pointer having a torsion spring which acts in the direction towards the end of the scale are brought together;
the pointer is brought to rest against the zero stop by means of a moment of rotation applied from the outside in opposition to the restoring force of the torsion spring;
the rotor of the stepping motor is turned in the direction towards the zero stop of the pointer by means of a rotating magnetic field with a carrying along of the gear wheels until no gearing play is present any longer; and
the rotor is held in the position reached and then magnetized in a predetermined angular direction.

Further according to the invention, the rotating magnetic field is produced in the manner that the coils of the stepping motor are acted on by an alternating electric current.

A further feature of the invention is that the alternating electric current is produced by two voltages which are 90° apart from each other.

Still further, the method of the invention provides an alternating field having a frequency of 5 Hz to 10 KHz.

According to another feature of the invention, the magnetic rotating field is produced by rotation of a magnet.

Furthermore, by another feature of the invention, the frequency of the magnetic rotating field is 2 Hz to 200 Hz.

Still according to a feature of the invention, a torsion spring is used, the maximum restoring moment of which is less than the holding moment of the magnetized rotor in the housing.

BRIEF DESCRIPTION OF THE DRAWING

With the above and other objects and advantages in view, the present invention will become more clearly understood in connection with the detailed description of the preferred embodiment, when considered with the accompanying drawing, wherein the sole FIGURE is a stylized view of the instrument to be presynchronized by the method of the invention.

DETAILED DESCRIPTION OF THE PREFERRED EMBODIMENT

The FIGURE shows an instrument 1 which is to be assembled and synchronized in accordance with the method of the invention. The instrument includes a scale 2 having marks 3 indicative of the quantity of a measurement performed by the instrument 1. A pointer 4 is supported by a shaft 5 extending through a face plate 6 of the scale 2. The marks 3 are disposed on the face plate 6, and rotation of the shaft 5 brings the pointer 4 to the mark 3 corresponding to the measured quantity. A first stop 7 extends forward of the plate 6 to contact the pointer 4 at a measurement value of zero, and a second stop 8 extends forward of the plate 6 to contact the pointer 4 at full scale.

A spring 9 extends from a frame element 10 of the instrument 1 to the shaft 5 to exert a torsional spring force upon the shaft 5 urging the shaft 5 to rotate towards the full-scale stop 8. The shaft 5 is rotated by a stepping motor 11 having a two-pole rotor 12 which drives the shaft 5 through a gear train 13. By way of example, the gear train 13 has a set of three gears, or gear wheels, 14, 15 and 16 connecting, via gear 14, with a pinion 17 on a shaft of the rotor 12, and via gear 16 with the pointer shaft 5. The gear train 13 reduces the amount of rotation of the shaft 5 relative to rotation of the rotor 12 by a fixed ratio.

The stepping motor 11 includes a stator 18 which encircles the rotor 12. The stator 18 comprises a ring-shaped housing 19 (shown partially cut away) of iron or similar magnetizable material with a set of four pole pieces 20 extending inwardly towards the rotor 12 from the housing 19. The pole pieces 20 are positioned symmetrically about the rotor 12 and spaced apart angularly from each other at 90° spacing. Each of the pole pieces 20 supports an enclosing coil 21 of electrically conductive wire, all four of the coils 21 connecting with a well-known control circuit 22 which energizes the coils 21 with electric current to induce rotation of the rotor 12. The circuitry 22 is activated and controlled by a microprocessor 23 having a counter 24 and a memory 25 for counting and storing rotational steps of the rotor 12.

In the practice of the methodology of the invention, the rotor 12 is initially in an unmagnetized state and, after assembly of the instrument 1, is given a desired direction of magnetization by application of a relatively large current in a pair of coils 26 diametrically opposed to the motor. This magnetization current is larger the running current of the motor 11, the running current being sufficiently low in amplitude so as to retain the state of magnetization of the rotor 12. The magnetization of the rotor 12 will be described in further detail hereinafter.

Using a non-magnetized rotor, the gear wheels of the multistep gearing between motor pinion and pointer shaft can be assembled without any specific association. They can be "shaken together" and need only be finally in mechanical engagement with each other. The pointer is then brought into the zero position against the restoring force of the spring by an externally applied moment of rotation. The rotor is then turned by a rotating magnetic field in the direction of the zero stop of the pointer, the gear wheels being carried along until no gear play is present any longer. Only then is the rotor magnetized, i.e. it receives its two-pole orientation, in which connection, as a result of the method, a given orientation of the poles towards the zero position of the pointer is simultaneously brought about. In this way, the mechanical presynchronization necessary for the shortened electronic synchronization process is obtained. There are no synchronization errors in assembly since the associating of rotor and pointer is effected only after the end of the assemblying. The synchronization cannot be lost as long as the gearing is not taken apart.

WE CLAIM:

1. A method of manufacturing an electronically synchronizable indicator instrument having a rotable pointer movable along a scale, wherein the pointer is rotated by a stepping motor operatively coupled to a shaft of the pointer via a multi-step gearing between a zero position and a full scale position, the instrument having a stop at the zero position, and wherein the stepping motor has a two-pole rotor of magnetizable material, two coils arranged perpendicular to the rotor, and a housing surrounding the coils, the motor being controlled by a microprocessor; the method comprising steps of:

providing the stepping motor with the rotor in a non magnetized state, coupling the rotor to the pointer shaft via the gearing, and connecting to the pointer shaft a torsion spring which acts in the direction towards the full scale end of the scale;

rotating the pointer to rest against the zero stop by means of a moment of rotation applied from outside the instrument in opposition to a restoring force of the torsion spring;

turning the rotor of the stepping motor in a direction towards the zero stop of the pointer by means of a rotating magnetic field, rotation of the rotor imparting rotation to gear wheels of the gearing to terminate any gearing play upon attainment of a reference position of the rotor; and holding the rotor in the reference position, and then magnetizing the rotor in a predetermined angular direction.

2. The method according to claim 1, further comprising a step of producing a rotating magnetic field by energizing the coils of the stepping motor with an alternating electric current to produce an alternating magnetic field.

3. The method according to claim 2, wherein
the alternating magnetic field is produced by two voltages which are 90° apart from each other.

4. The method according to claim 3, wherein
an alternating field has a frequency of 5 Hz to 10KHz.

5. The method according to claim 2, wherein
the frequency of the magnetic rotating field is 2 Hz to 200 Hz.

6. The method according to claim 1, further comprising a step of providing to the torsion spring a maximum restoring moment which is less than a holding moment of the rotor in magnetized state in the housing.

7. The method according to claim 1, wherein
the magnetic rotating field is produced by rotation of a magnet.

* * * * *